United States Patent
Gu et al.

(10) Patent No.: US 12,431,351 B2
(45) Date of Patent: Sep. 30, 2025

(54) METHOD OF FORMING GERMANIUM ANTIMONY TELLURIUM FILM

(71) Applicant: SAMSUNG ELECTRONICS CO., LTD., Suwon-si (KR)

(72) Inventors: Donggeon Gu, Hwaseong-si (KR); Won-Jun Lee, Seoul (KR); Changyup Park, Hwaseong-si (KR); Dongho Ahn, Hwaseong-si (KR); Yewon Kim, Seoul (KR); Kwonyoung Kim, Seoul (KR); Okhyeon Kim, Seoul (KR)

(73) Assignees: SAMSUNG ELECTRONICS CO., LTD., Suwon-si (KR); Industry Academy Cooperation Foundation Of Sejong University, Seoul (KR)

( * ) Notice: Subject to any disclaimer, the term of this patent is extended or adjusted under 35 U.S.C. 154(b) by 438 days.

(21) Appl. No.: 18/095,243

(22) Filed: Jan. 10, 2023

(65) Prior Publication Data
US 2023/0230832 A1 Jul. 20, 2023

(30) Foreign Application Priority Data
Jan. 18, 2022 (KR) .................. 10-2022-0007474

(51) Int. Cl.
*H01L 21/02* (2006.01)
*C23C 16/06* (2006.01)
(Continued)

(52) U.S. Cl.
CPC ........ *H01L 21/02568* (2013.01); *C23C 16/06* (2013.01); *C23C 16/45527* (2013.01);
(Continued)

(58) Field of Classification Search
CPC ......... H01L 21/02568; H01L 21/02614; H01L 21/0262; C23C 16/06; C23C 16/45527; C23C 16/56; H10B 63/10; H10B 63/84
See application file for complete search history.

(56) References Cited

U.S. PATENT DOCUMENTS

| | | | |
|---|---|---|---|
| 7,838,329 | B2 | 11/2010 | Hunks et al. |
| 8,003,162 | B2 | 8/2011 | Shin et al. |

(Continued)

FOREIGN PATENT DOCUMENTS

| | | |
|---|---|---|
| KR | 1020090116500 A | 11/2009 |
| KR | 1020100137577 A | 12/2010 |

(Continued)

OTHER PUBLICATIONS

AVS-67 Plenary & Awards Session Technical Program, Oct. 25-27, 2021.

*Primary Examiner* — Jay C Kim
*Assistant Examiner* — Woo K Lee
(74) *Attorney, Agent, or Firm* — Muir Patent Law, PLLC

(57) ABSTRACT

A method of forming a germanium antimony tellurium (GeSbTe) layer includes forming a germanium antimony (GeSb) layer by repeatedly performing a GeSb supercycle; and forming the GeSbTe layer by performing a tellurization operation on the GeSb layer, wherein the GeSb supercycle includes performing at least one GeSb cycle; and performing at least one Sb cycle, the GeSbTe has a composition of $Ge_2Sb_{2+a}Te_{5+b}$, in which a and b satisfy the following relations: $-0.2<a<0.2$ and $-0.5<b<0.5$.

20 Claims, 16 Drawing Sheets

(51) Int. Cl.
*C23C 16/455* (2006.01)
*C23C 16/56* (2006.01)
*H10B 63/00* (2023.01)
*H10B 63/10* (2023.01)

(52) U.S. Cl.
CPC ........ *C23C 16/56* (2013.01); *H01L 21/02614* (2013.01); *H01L 21/0262* (2013.01); *H10B 63/10* (2023.02); *H10B 63/84* (2023.02)

(56) References Cited

U.S. PATENT DOCUMENTS

| | | |
|---|---|---|
| 9,065,048 B2 | 6/2015 | Marsh |
| 9,175,390 B2 | 11/2015 | Pore et al. |
| 9,315,896 B2 | 4/2016 | Pore et al. |
| 11,094,558 B2 | 8/2021 | Lee et al. |
| 2008/0035906 A1* | 2/2008 | Park .................... H10N 70/231 438/102 |
| 2009/0280599 A1* | 11/2009 | Im ...................... H10N 70/8413 438/102 |
| 2010/0009078 A1* | 1/2010 | Pore .................... C07F 11/005 556/9 |
| 2012/0028410 A1* | 2/2012 | Marsh ................. H10N 70/231 438/102 |
| 2014/0308802 A1* | 10/2014 | Xiao ................. C23C 16/45525 438/483 |

FOREIGN PATENT DOCUMENTS

| | | |
|---|---|---|
| KR | 1020140123451 A | 10/2014 |
| KR | 10-1523172 B1 | 5/2015 |
| KR | 10-1851722 B1 | 6/2018 |
| KR | 10-1952729 B1 | 2/2019 |
| KR | 10-1935348 B1 | 4/2019 |

* cited by examiner

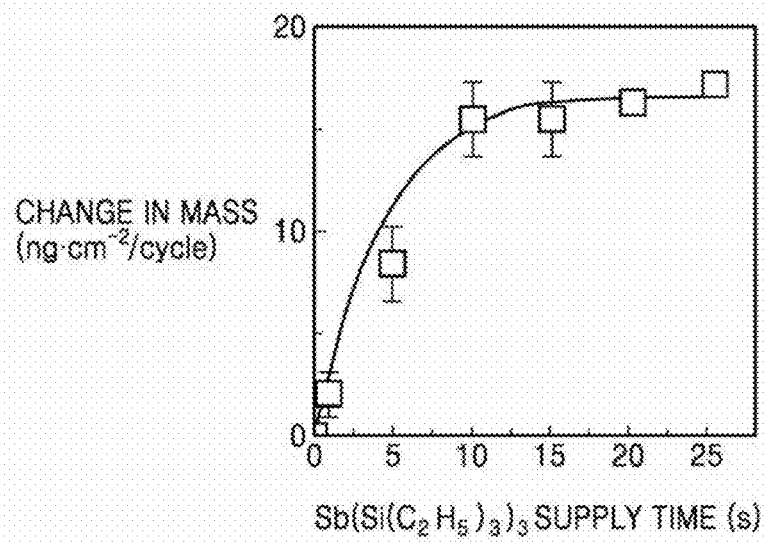

METHOD OF FORMING GERMANIUM ANTIMONY TELLURIUM FILM

CROSS-REFERENCE TO RELATED APPLICATION

This application is based on and claims priority under 35 U.S.C. § 119 to Korean Patent Application No. 10-2022-0007474, filed on Jan. 18, 2022, in the Korean Intellectual Property Office, the disclosure of which is incorporated by reference herein in its entirety.

BACKGROUND

1. Field

Embodiments relate to a method of forming a germanium antimony tellurium (GeSbTe) film.

2. Description of the Related Art

A phase change memory is a kind of nonvolatile memory and a next-generation memory semiconductor that combines advantages, such as the nonvolatility of flash memory and the faster speeds of random-access memory (RAM). The phase change memory may use a phase change material in which phase shift occurs between an amorphous state and a crystalline state according to heating.

SUMMARY

The embodiments may be realized by providing a method of forming a germanium antimony tellurium (GeSbTe) layer, the method including forming a germanium antimony (GeSb) layer by repeatedly performing a GeSb supercycle; and forming the GeSbTe layer by performing a tellurization operation on the GeSb layer, wherein performing the GeSb supercycle includes performing at least one GeSb cycle; and performing at least one Sb cycle, GeSbTe of the GeSbTe layer has a composition of $Ge_2Sb_{2+a}Te_{5+b}$, in which a and b satisfy the following relations: $-0.2<a<0.2$ and $-0.5<b<0.5$.

The embodiments may be realized by providing a method of forming a GeSbTe layer, the method including forming a GeSb layer by repeatedly performing a GeSb supercycle; and forming the GeSbTe layer by performing a tellurization operation on the GeSb layer, wherein performing the GeSb supercycle includes performing at least one GeSb cycle; and performing at least one Sb cycle, GeSbTe of the GeSbTe layer has a composition of $Ge_2Sb_{2+a}Te_{5+b}$, in which a and b satisfy the following relations: $-0.2<a<0.2$ and $-0.5<b<0.5$, performing the at least one GeSb cycle includes pulsing a Ge precursor; purging the Ge precursor; pulsing an Sb precursor; and purging the Sb precursor, performing the at least one Sb cycle includes pulsing a first Sb precursor; purging the first Sb precursor; pulsing a second Sb precursor; and purging the second Sb precursor, and performing the tellurization operation includes pulsing a Te precursor; and purging the Te precursor.

The embodiments may be realized by providing a method of forming a GeSbTe layer, the method including forming a GeSb layer by repeatedly performing a GeSb supercycle; and forming the GeSbTe layer by performing a tellurization operation on the GeSb layer, wherein performing the GeSb supercycle includes performing at least one GeSb cycle; and performing at least one Sb cycle, GeSbTe of the GeSbTe layer has a composition of $Ge_2Sb_{2+a}Te_{5+b}$, in which a and b satisfy the following relations: $-0.2<a<0.2$ and $-0.5<b<0.5$, performing the at least one GeSb cycle includes pulsing $GeCl_2 \cdot C_4H_8O_2$; purging the $GeCl_2 \cdot C_4H_8O_2$; pulsing $Sb(Si(C_2H_5)_3)_3$; and purging the $Sb(Si(C_2H_5)_3)_3$, and performing the at least one Sb cycle includes pulsing $SbCl_3$; purging the $SbCl_3$; pulsing $Sb(Si(C_2H_5)_3)_3$; and purging the $Sb(Si(C_2H_5)_3)_3$.

BRIEF DESCRIPTION OF THE DRAWINGS

Features will be apparent to those of skill in the art by describing in detail exemplary embodiments with reference to the attached drawings in which:

FIG. 7B is a graph showing a change in mass of a sample according to an Sb precursor supply time;

DETAILED DESCRIPTION

As used herein, the terms "or" and "and/or" include any and all combinations of one or more of the associated listed items, e.g., "A or B" would include A, B, or A and B. Expressions such as "at least one of," when preceding a list of elements, modify the entire list of elements and do not modify the individual elements of the list.

Figure 1:
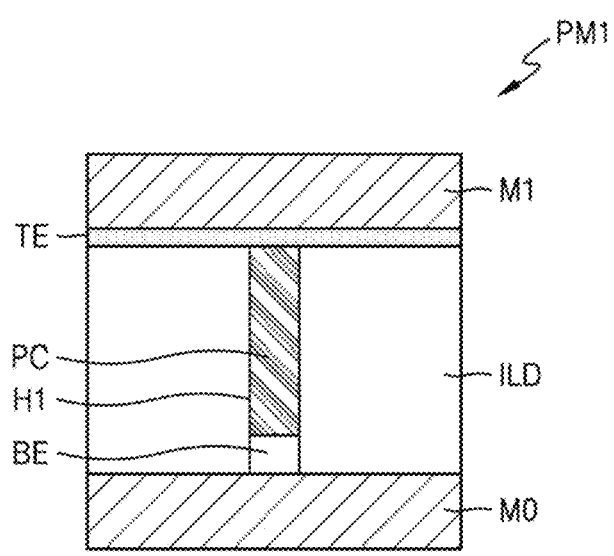
FIG. 1 is a cross-sectional view of a memory device according to an embodiment.

FIG. 1 is a cross-sectional view of a phase change memory device according to an embodiment.

Referring to FIG. 1, a phase change memory device PM1 may include a lower conductive line M0, an interlayer insulating layer ILD, a bottom electrode BE, a phase change layer PC, a top electrode TE, and an upper conductive line M1.

The lower conductive line M0 may include a metal, a conductive metal nitride, a conductive metal oxide, or a combination thereof. In an implementation, the lower conductive line M0 may include, e.g., tungsten (W), tungsten nitride (WN), gold (Au), silver (Ag), copper (Cu), aluminum (Al), titanium aluminum nitride (TiAlN), iridium (Ir), platinum (Pt), palladium (Pd), ruthenium (Ru), zirconium (Zr), rhodium (Rh), nickel (Ni), cobalt (Co), chromium (Cr), tin (Sn), zinc (Zn), indium tin oxide (ITO), or a combination thereof.

The interlayer insulating layer ILD may be on the lower conductive line M0. The interlayer insulating layer ILD may include, e.g., silicon oxide, silicon nitride, or a combination thereof.

The bottom electrode BE may be on the lower conductive line M0. The bottom electrode BE may be in a hole H1 of or in the interlayer insulating layer ILD. The bottom electrode BE may include a metal, a conductive metal nitride, a conductive metal oxide, or a carbon material. In an implementation, the bottom electrode BE may include carbon (C).

The phase change layer PC may be on the bottom electrode BE. The phase change layer PC may be in the hole H1 of the interlayer insulating layer ILD. The phase change layer PC may include, e.g., GeSbTe. The phase change layer PC may include a GeSbTe film or layer formed according to a manufacturing method according to an embodiment. In order to form a GeSbTe film in the hole H1 of the interlayer insulating layer ILD having a high aspect ratio, a method of forming a GeSbTe film having a high step coverage may be used as in the method of manufacturing a GeSbTe film according to an embodiment. In an implementation, a GeSbTe film may be manufactured using atomic layer deposition (ALD), and the GeSbTe film manufactured according to an embodiment may exhibit high step coverage.

The top electrode TE may be on the interlayer insulating layer ILD and the phase change layer PC. The top electrode TE may include a metal, a conductive metal nitride, a conductive metal oxide, or a carbon material. In an implementation, the top electrode TE may include carbon (C).

The upper conductive line M1 may be on the top electrode TE. The upper conductive line M1 may include a metal, a conductive metal nitride, a conductive metal oxide, or a combination thereof. In an implementation, the upper conductive line M1 may include, e.g., tungsten (W), tungsten nitride (WN), gold (Au), silver (Ag), copper (Cu), aluminum (Al), titanium aluminum nitride (TiAlN), iridium (Ir), platinum (Pt), palladium (Pd), ruthenium (Ru), zirconium (Zr), rhodium (Rh), nickel (Ni), cobalt (Co), chromium (Cr), tin (Sn), zinc (Zn), indium tin oxide (ITO), or a combination thereof.

In an implementation, the lower conductive line M0 and the upper conductive line M1 may be referred to as a word line and a bit line, respectively. In an implementation, the lower conductive line M0 and the upper conductive line M1 may be referred to as a bit line and a word line, respectively.

A confined cell structure in which the phase change material layer PC is in the hole H1 of the interlayer insulating layer ILD may help reduce a reset current, as compared with a planar cell structure. The temperature change of a neighboring memory cell when the reset current is applied to the confined cell structure may be less than the temperature change of a neighboring memory cell when the reset current is applied to the planar cell structure. In an implementation, the confined cell structure may help reduce thermal interference between memory cells.

Figure 2:
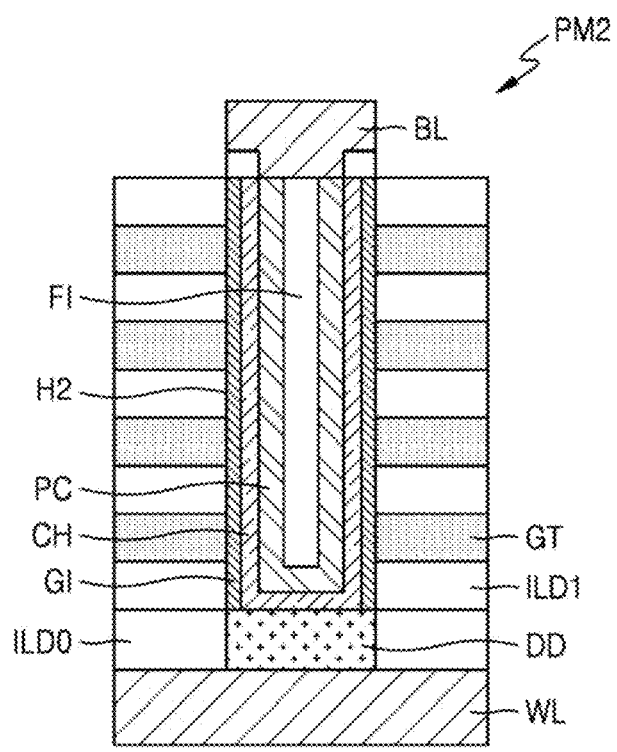
FIG. 2 is a cross-sectional view of a memory device according to an embodiment.

FIG. 2 is a cross-sectional view of a memory device PM2 according to an embodiment.

Referring to FIG. 2, the memory device PM2 may include a lower conductive line WL, a diode DD, a lower interlayer insulating layer ILD0, an interlayer insulating layer ILD1, a gate layer GT, a gate insulating layer GI, a channel layer CH, a phase change layer PC, a filling insulating layer FI, and an upper conductive line BL.

The lower conductive line WL may include a metal, a conductive metal nitride, a conductive metal oxide, or a combination thereof. In an implementation, the lower conductive line WL may include tungsten (W), tungsten nitride (WN), gold (Au), silver (Ag), copper (Cu), aluminum (Al), titanium aluminum nitride (TiAlN), iridium (Ir), platinum (Pt), palladium (Pd), ruthenium (Ru), zirconium (Zr), rhodium (Rh), nickel (Ni), cobalt (Co), chromium (Cr), tin (Sn), zinc (Zn), indium tin oxide (ITO), or a combination thereof.

The diode DD may be on the lower conductive line WL. The diode DD may include, e.g., a polysilicon diode.

The lower interlayer insulating layer ILD0 may be on the lower conductive line WL and may surround the diode DD. The lower interlayer insulating layer ILD0 may include, e.g., silicon oxide, silicon nitride, or a combination thereof.

A plurality of interlayer insulating layers ILD1 and a plurality of gate layers GT may be alternately stacked one-by-one on the lower interlayer insulating layers ILD0. The interlayer insulating layer ILD1 may include silicon oxide, silicon nitride, or a combination thereof. The gate layer GT may include, e.g., tungsten (W), nickel (Ni), cobalt (Co), tantalum (Ta), tungsten nitride (WN), titanium nitride (TiN), tantalum nitride (TaN), or a combination thereof.

The gate insulating layer GI may be on a sidewall of a hole H2 penetrating the plurality of interlayer insulating layers ILD1 and the plurality of gate layers GT and exposing the diode DD. The gate insulating layer GI may include, e.g., a silicon oxide ($SiO_2$), a hafnium oxide ($HfO_2$), an aluminum oxide ($Al_2O_3$), a zirconium oxide ($ZrO_2$), a tantalum oxide ($Ta_2O_5$), or a combination thereof.

The channel layer CH may be on the gate insulating layer GI and the diode DD. The channel layer CH may include a semiconductor material, e.g., a group IV semiconductor material, a group III-V semiconductor material, or a group II-VI semiconductor material. The group IV semiconductor material may include, e.g., silicon (Si), germanium (Ge), or silicon (Si)-germanium (Ge). The group III-V semiconductor material may include, e.g., gallium arsenic (GaAs), indium phosphorus (InP), gallium phosphorus (GaP), indium arsenic (InAs), indium antimony (InSb), or indium gallium arsenic (InGaAs). The group II-VI semiconductor material may include, e.g., zinc telluride (ZnTe) or cadmium sulfide (CdS).

The phase change layer PC may be on the channel layer CH. The phase change layer PC may include, e.g., GeSbTe. In an implementation, the phase change layer PC may include, e.g., a GeSbTe film formed according to a manufacturing method according to an embodiment. In order to form a GeSbTe film in a space surrounded by the channel layer CH having a high aspect ratio, a method of forming a GeSbTe film having a high step coverage may be used as in the method of manufacturing a GeSbTe film according to an embodiment. In an implementation, a GeSbTe film may be manufactured using atomic layer deposition, and the GeSbTe film manufactured may exhibit high step coverage.

The filling insulating layer FI may fill a space surrounded by the phase change layer PC. In an implementation, the filling insulating layer FI may include silicon oxide, silicon nitride, or a combination thereof.

The upper conductive line BL may be on the phase change layer PC. The upper conductive line BL may include, e.g., a metal, a conductive metal nitride, a conductive metal oxide, or a combination thereof. In an implementation, the upper conductive line BL may include, e.g., tungsten (W), tungsten nitride (WN), gold (Au), silver (Ag), copper (Cu), aluminum (Al), titanium aluminum nitride (TiAlN), iridium (Ir), platinum (Pt), palladium (Pd), ruthenium (Ru), zirconium (Zr), rhodium (Rh), nickel (Ni), cobalt (Co), chromium (Cr), tin (Sn), zinc (Zn), indium tin oxide (ITO), or a combination thereof.

In an implementation, the lower conductive line WL and the upper conductive line BL may be referred to as a word line and a bit line, respectively. In an implementation, the lower conductive line WL and the upper conductive line BL may be referred to as a bit line and a word line, respectively.

Figure 3:
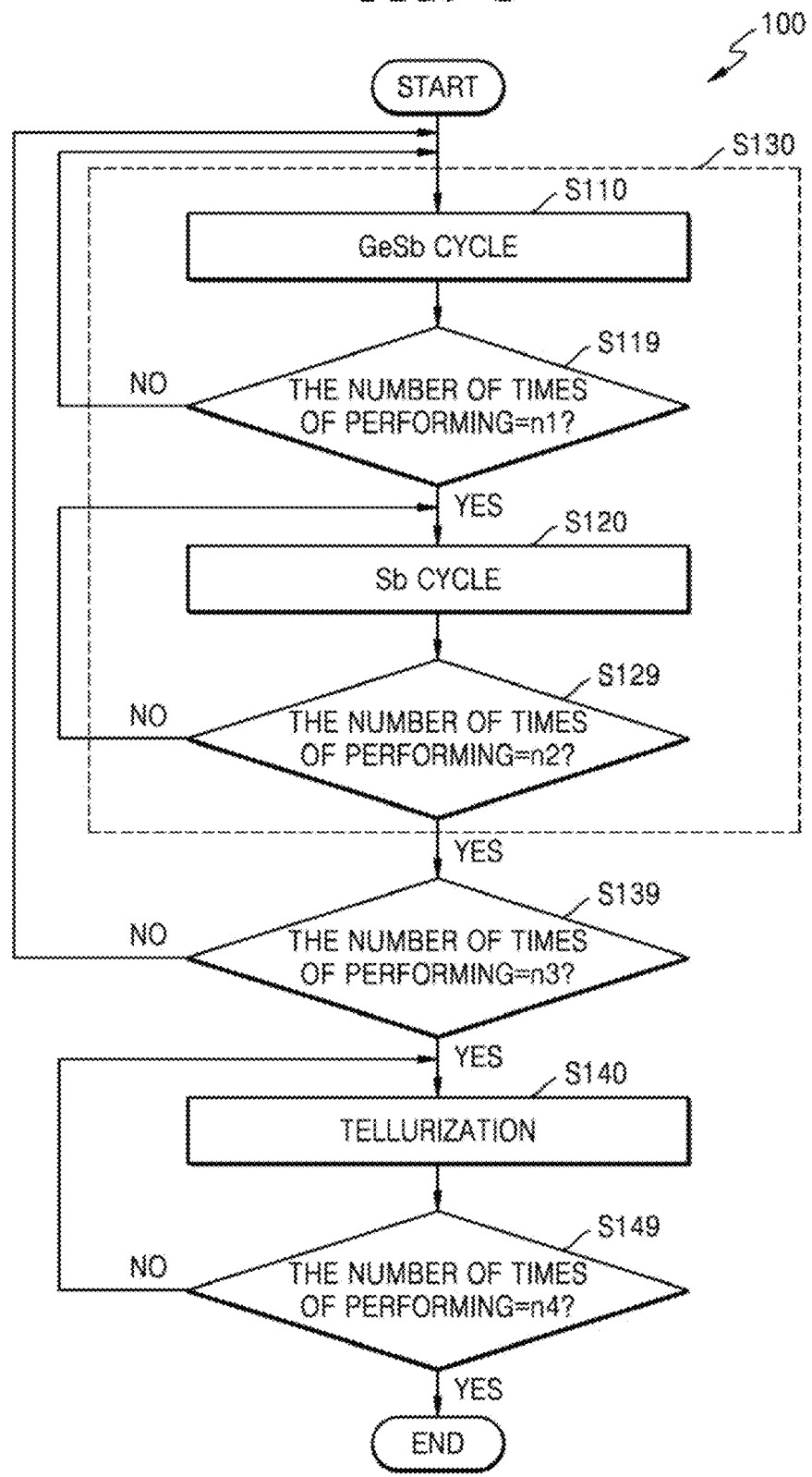
FIG. 3 is a flowchart of a method of forming a GeSbTe film, according to an embodiment.

FIG. 3 is a flowchart of a method 100 of forming a GeSbTe film, according to an embodiment.

Referring to FIG. 3, the method 100 of forming a GeSbTe film, in accordance with an embodiment, may include, e.g., forming a GeSb layer by repeating a germanium antimony (GeSb) supercycle S130; and a tellurization operation of forming a germanium antimony tellurium (GeSbTe) layer from the GeSb layer. The GeSb supercycle may be performed a predetermined number of times n3 (S139). The tellurization operation S140 may be performed a predetermined number of times n4. In an implementation, n3 and n4 may each be a suitable natural number.

The GeSb supercycle S130 may include operation S119 of performing the GeSb cycle S110 a predetermined number of times n1 and operation S129 of performing the Sb cycle S120 a predetermined number of times n2. In an implementation, n1 and n2 may each be a suitable natural number. By adjusting the ratio of n1 to n2, the composition ratio of Ge to Sb of the GeSbTe film may be adjusted. In an implementation, in the method of forming the GeSbTe film, the composition ratio of Ge to Sb of the GeSbTe film may be adjusted by adjusting the ratio of the number of times of performing the GeSb cycle S110 to that of the Sb cycle S120. In an implementation, the Ge to Sb ratio may be adjusted in the range of 0.5:1 to 2.5:1 by adjusting the n1 to n2 ratio in the range of 1:1 to 1:0. In an implementation, in the method of forming a GeSbTe film, a GeSbTe film with a composition of or close to $Ge_2Sb_2Te_5$ may be formed. In an implementation, the $Ge_2Sb_{2+a}Te_{5+b}$ (in which a and b satisfy the following relations: $-0.2<a<0.2$ and $-0.5<b<0.5$) film may be formed. The GeSbTe film with a composition in this range may be stable, phase separation may not occur due to other compositions during phase changes, and it may take a short time to change from crystalline phase to amorphous phase.

Figure 4:
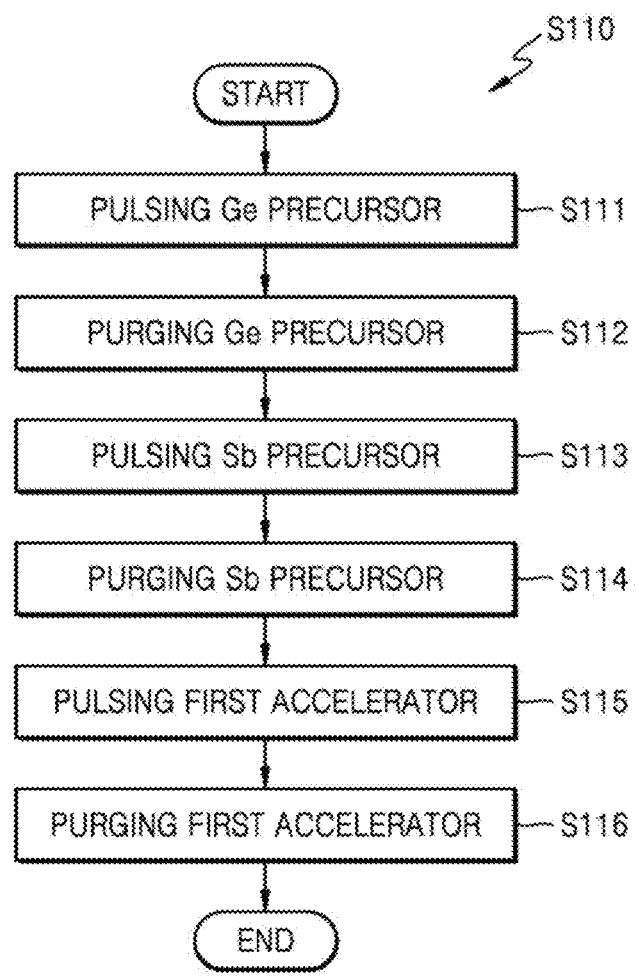
FIG. 4 is a flowchart of a GeSb cycle according to an embodiment.

FIG. 4 is a flowchart of a GeSb cycle S110 according to an embodiment.

Referring to FIG. 4, the GeSb cycle S110 may include operation S111 of pulsing a Ge precursor, operation S112 of purging the Ge precursor, operation S113 of pulsing an Sb precursor, and operation S114 of purging the Sb precursor. In an implementation, as illustrated in FIG. 4, operation S111 of pulsing the Ge precursor and operation S112 of purging the Ge precursor are performed before operation S113 of pulsing the Sb precursor and operation S114 of purging the Sb precursor. In an implementation, operation S111 of pulsing the Ge precursor and operation S112 of purging the Ge precursor may be performed after operation S113 of pulsing the Sb precursor and operation S114 of purging the Sb precursor.

In the GeSb cycle S110, the number of times of performing operation S111 of pulsing the Ge precursor and the number of times of performing operation S112 of purging the Ge precursor may be equal to the number of times of performing operation S113 of pulsing the Sb precursor and the number of times of performing operation S114 of purging the Sb precursor. It may be difficult to adjust a concentration ratio of Ge to Sb in the GeSb film formed by the GeSb cycle S110.

In an implementation, the GeSb cycle S110 may be performed at a pressure of, e.g., about 0.1 Torr to about 10 Torr. In an implementation, the GeSb cycle S110 may be performed at a temperature of, e.g., about 70° C. to about 130° C. Maintaining the temperature of the GeSb cycle S110 at about 70° C. or greater may help ensure that deposition occurs, due to sufficient reaction energy of the Ge precursor and the Sb precursor. In addition, condensation of the Ge precursor and the Sb precursor in the reactor may be prevented. In addition, the quality of the formed GeSbTe film may be improved. Maintaining the temperature of the GeSb cycle S110 at about 130° C. or less may help prevent thermal decomposition of the Ge precursor and the Sb precursor from occurring, thereby facilitating chemical adsorption of the Ge precursor and the Sb precursor.

The Ge precursor may include, e.g., $Ge(CH_3)_4$, $Ge(C_2H_5)_4$, $Ge(^iC_3H_7)_4$, $Ge(N(CH_3)_2)_4$, $Ge(N(C_2H_5)_2)_4$, $Ge(OCH_3)_4$, $Ge(OC_2H_5)_4$, $Ge(O(^iC_3H_7)_4)$, $GeCl_2 \cdot C_4H_8O_2$, $GeCl_4$, $GeF_4$, $HGeCl_3$, germylene, or Ge(II)-amido guanidinate. In the Ge precursors, $^iC_3H_7$ is isopropyl. In operation S111 of pulsing the Ge precursor, the Ge precursor may be supplied for about 10 seconds to about 20 seconds. In an implementation, the Ge precursor supply time may vary depending on the deposition equipment. If the Ge precursor supply time were to be too long, productivity could decrease due to an increase in the process time. In addition, the Ge precursor purge time could increase. Chemicals could also be wasted. If the Ge precursor supply time were to be too short, the step coverage could be reduced.

In operation S112 of purging the Ge precursor, argon (Ar) or nitrogen ($N_2$) may be used. In an implementation, the Ge precursor purge time may be about 10 seconds to about 30 seconds. In an implementation, the Ge precursor purge time may vary depending on the deposition equipment. If the Ge precursor purge time were to be too long, productivity could decrease due to an increase in the process time. If the Ge precursor purge time were to be too short, chemical vapor deposition (CVD) could simultaneously occur, and thus, step coverage could reduce. In addition, deposition equipment could also be contaminated.

The Sb precursor may include, e.g., $SbCl_3$, $Sb(Si(CH_3)_3)_3$, $Sb(Si(C_2H_5)_3)_3$, $Sb(Si(^iC_3H_7)_3)_3$, $Sb(Si(N(CH_3)_2)_3)_3$, $Sb(Si(N(C_2H_5)_2)_3)_3$, $Sb(Ge(CH_3)_3)_3$, $Sb(Ge(C_2H_5)_3)_3$, $Sb(Ge(N(CH_3)_2)_3)_3$, or $Sb(Ge(N(C_2H_5)_2)_3)_3$. In an implementation, in operation S113 of pulsing the Sb precursor, the Sb precursor may be supplied for about 10 seconds to about 25 seconds. In an implementation, the Sb precursor supply time may vary depending on the deposition equipment. If the Sb precursor supply time were to be too long, productivity could decrease due to an increase in the process time. In addition, the Sb precursor purge time could increase. Chemicals could also be wasted. If the Sb precursor supply time were to be too short, the step coverage could be reduced.

In operation S114 of purging the Sb precursor, argon (Ar) or nitrogen ($N_2$) may be used. In an implementation, the Sb precursor purge time may be about 10 seconds to about 30 seconds. In an implementation, the Sb precursor purge time may vary depending on the deposition equipment. If the Sb precursor purge time were to be too long, productivity could decrease due to an increase in the process time. If the Sb precursor purge time were to be too short, CVD could occur simultaneously, and thus, step coverage could reduce. In addition, deposition equipment could also be contaminated.

Referring to FIG. 4, the GeSb cycle S110 may further include operation S115 of pulsing a first accelerator and operation S116 of purging the first accelerator. In an implementation, as illustrated in FIG. 4, operation S115 of pulsing the first accelerator and operation S116 of purging the first accelerator may be performed after operation S113 of pulsing the Sb precursor and operation S114 of purging the Sb precursor. In an implementation, operation S115 of pulsing the first accelerator and operation S116 of purging the first accelerator may be performed before operation S111 of pulsing the Ge precursor and operation S112 of purging the Ge precursor. In an implementation, operation S115 of pulsing the first accelerator and operation S116 of purging the first accelerator may be respectively performed simultaneously with operation S111 of pulsing the Ge precursor and operation S112 of purging the Ge precursor. In an implementation, operation S115 of pulsing the first accelerator and operation S116 of purging the first accelerator may be performed between operation S112 of purging the Ge precursor and operation S113 of pulsing the Sb precursor. In an implementation, operation S115 of pulsing the first accelerator and operation S116 of purging the first accelerator may be respectively performed simultaneously with operation S113 of pulsing the Sb precursor and operation S114 of purging the Sb precursor.

The first accelerator may include, e.g., ammonia or an alcohol. The alcohol may include, e.g., methanol or ethanol. In operation S116 of purging the first accelerator, argon (Ar) or nitrogen ($N_2$) may be used.

Figure 5:
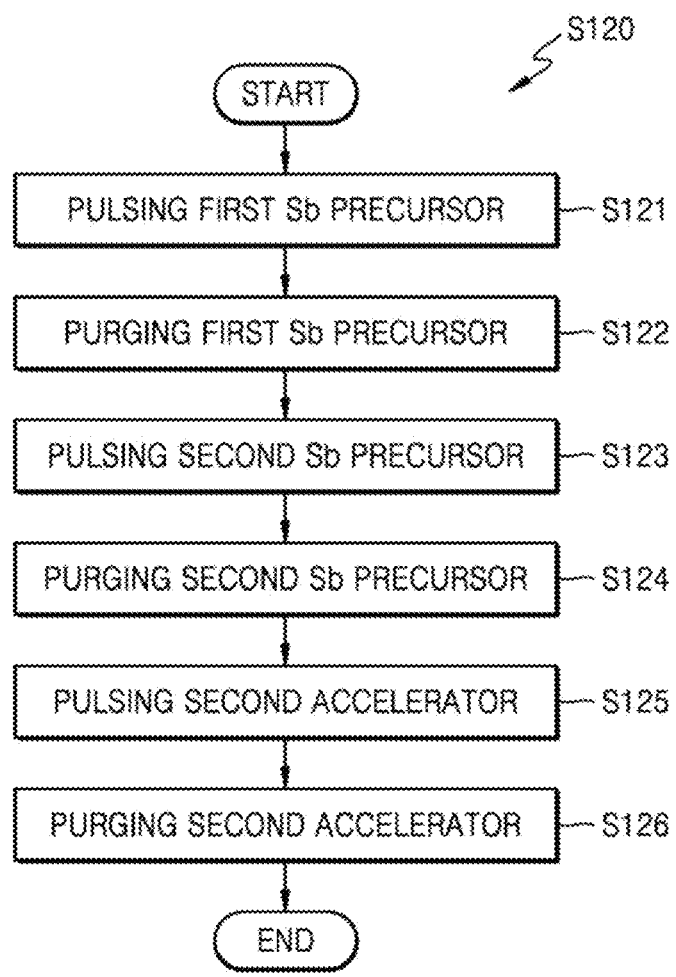
FIG. 5 is a flowchart of an Sb cycle according to an embodiment.

FIG. 5 is a flowchart of an Sb cycle S120 according to an embodiment.

Referring to FIG. 5, the Sb cycle S120 may include operation S121 of pulsing a first Sb precursor, operation S122 of purging the first Sb precursor, operation S123 of pulsing a second Sb precursor, and operation S124 of purging the second Sb precursor. In an implementation, as illustrated in FIG. 5, operation S121 of pulsing the first Sb precursor and operation S122 of purging the first Sb precursor may be performed before operation S123 of pulsing the second Sb precursor and operation S124 of purging the second Sb precursor. In an implementation, operation S121 of pulsing the first Sb precursor and operation S122 of purging the first Sb precursor may be performed after operation S123 of pulsing the second Sb precursor and operation S124 of purging the second Sb precursor.

In an implementation, the Sb cycle S120 may be performed at a pressure of, e.g., about 0.1 Torr to about 10 Torr. In an implementation, the Sb cycle S120 may be performed at a temperature of, e.g., about 70° C. to about 130° C. Maintaining the temperature of the Sb cycle S120 at about 70° C. or less may help ensure that deposition may occur due to sufficient reaction energy of the first Sb precursor and the second Sb precursor. In addition, condensation of the first Sb precursor and the second Sb precursor in the reactor may be prevented. In addition, the quality of the formed GeSbTe film may be improved. Maintaining the temperature of the Sb cycle S120 at about 130° C. or less may help prevent thermal decomposition of the first Sb precursor and the second Sb precursor, thereby facilitating chemical adsorption of the first Sb precursor and the second Sb precursor.

The first Sb precursor may include, e.g., $SbCl_3$, $SbF_3$, $SbBr_3$, or $SbI_3$. In an implementation, in operation S121 of pulsing the first Sb precursor, the first Sb precursor may be supplied for about 5 seconds to about 20 seconds. In an implementation, the first Sb precursor supply time may vary depending on the deposition equipment. In an implementation, the first Sb precursor supply time may be about 0.01 seconds to about 100 seconds. If the first Sb precursor supply time were to be too long, productivity could decrease due to an increase in the process time. In addition, the first Sb precursor purge time could increase. Chemicals could also be wasted. If the first Sb precursor supply time were to be too short, the step coverage of the formed GeSbTe film could be reduced.

In operation S122 of purging the first Sb precursor, argon (Ar) or nitrogen ($N_2$) may be used. In an implementation, the first Sb precursor purge time may be about 10 seconds to about 30 seconds. In an implementation, the first Sb precursor purge time may vary depending on the deposition equipment. If the first Sb precursor purge time were to be too long, productivity could decrease due to an increase in the process time. If the first Sb precursor purge time were to be too short, CVD could occur simultaneously, and thus, step coverage could reduce. In addition, deposition equipment could also be contaminated.

The second Sb precursor may include, e.g., $Sb(Si(CH_3)_3)_3$, $Sb(Si(C_2H_5)_3)_3$, $Sb(Si(^iC_3H_7)_3)_3$, $Sb(Si(N(CH_3)_2)_3)_3$, $Sb(Si(N(C_2H_5)_2)_3)_3$, $Sb(Ge(CH_3)_3)_3$, $Sb(Ge(C_2H_5)_3)_3$, $Sb(Ge(N(CH_3)_2)_3)_3$, or $Sb(Ge(N(C_2H_5)_2)_3)_3$. In an implementation, in operation S123 of pulsing the second Sb precursor, the second Sb precursor may be supplied for about 15 seconds to about 60 seconds. In an implementation, the second Sb precursor supply time may vary depending on the deposition equipment. In an implementation, the second Sb precursor supply time may be about 0.01 seconds to about 100 seconds. If the second Sb precursor supply time were to be too long, productivity could decrease due to an increase in the process time. In addition, the second Sb precursor purge time could increase. Chemicals could also be wasted. If the second Sb precursor supply time were to be too short, the step coverage of the formed GeSbTe film could be reduced.

In operation S124 of purging the second Sb precursor, argon (Ar) or nitrogen ($N_2$) may be used. In an implementation, the second Sb precursor purge time may be about 20 seconds to about 60 seconds. In an implementation, the second Sb precursor purge time may vary depending on the deposition equipment. If the second Sb precursor purge time were to be too long, productivity could decrease due to an increase in the process time. If the second Sb precursor purge time were to be too short, CVD could occur simultaneously, and thus, step coverage could reduce. In addition, deposition equipment could also be contaminated.

Referring to FIG. 5, the Sb cycle S120 may further include operation S125 of pulsing a second accelerator and operation S126 of purging the second accelerator. In an implementation, as illustrated in FIG. 5, operation S125 of pulsing the second accelerator and operation S126 of purging the second accelerator may be performed after operation S123 of pulsing the second Sb precursor and operation S124 of purging the second Sb precursor. In an implementation, operation S125 of pulsing the second accelerator and operation S126 of purging the second accelerator may be performed before operation S121 of pulsing the first Sb precursor and operation S122 of purging the first Sb precursor. In an implementation, operation S125 of pulsing the second accelerator and operation S126 of purging the second accelerator may be respectively performed simultaneously with operation S121 of pulsing the first Sb precursor and operation S122 of purging the first Sb precursor. In an implementation, operation S125 of pulsing the second accelerator and operation S126 of purging the second accelerator may be performed between operation S122 of purging the first Sb precursor and operation S123 of pulsing the second Sb precursor. In an implementation, operation S125 of pulsing the second accelerator and operation S126 of purging the second accelerator may be respectively performed simultaneously with operation S123 of pulsing the second Sb precursor and operation S124 of purging the second Sb precursor.

The second accelerator may include, e.g., ammonia or an alcohol. The alcohol may include, e.g., methanol or ethanol. In operation S126 of purging the second accelerator, argon (Ar) or nitrogen ($N_2$) may be used.

Figure 6:
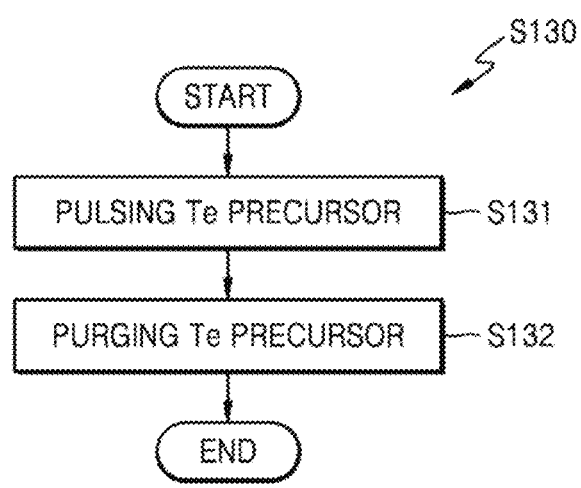
FIG. 6 is a flowchart of a tellurization operation according to an embodiment.

FIG. 6 is a flowchart of tellurization operation S130 according to an embodiment.

Referring to FIG. 6, the tellurization operation S130 may include operation S131 of pulsing a Te precursor and operation S132 of purging the Te precursor. In an implementation, the tellurization operation S130 may be performed at a pressure of about 0.1 Torr to about 10 Torr. In an implementation, the tellurization operation S130 may be performed at a temperature of about 200° C. to about 250° C. Maintaining the temperature of the tellurization operation S130 at about 200° C. or greater may facilitate diffusion of Te, thereby ensuring that a tellurization reaction occurs. Maintaining the temperature of the tellurization operation S130 at about 250° C. or less may help prevent thermal decomposition of the Te precursor, thereby preventing a Te film from accumulating on the GeSb thin film.

The Te precursor may include, e.g., $H_2Te$, $Te(CH_3)_2$, $Te(C_2H_5)_2$, $Te(^iC_3H_7)_2$, $Te(^tC_4H_9)_2$, $Te(N(CH_3)_2)_2$, $Te(N(^iC_2H_5)_2)_2$, $Te(N(^iC_3H_7)_2)_2$, $Te(OCH_3)_2$, $Te(OC_2H_5)_2$, $Te(O(^iC_3H_7)_2)_2$, $Te(Si(CH_3)_3)_2$, $Te(Si(C_2H_5)_3)_2$, $Te(Si(^iC_3H_7)_3)_2$, $Te(Si(N(CH_3)_2)_3)_2$, $Te(Si(N(C_2H_5)_2)_3)_2$, $Te(Ge(CH_3)_3)_2$, $Te(Ge(C_2H_5)_3)_2$, $Te(Ge(N(CH_3)_2)_3)_2$, or $Te(Ge(N(C_2H_5)_2)_3)_2$. In an implementation, in operation S131 of pulsing the Te precursor, the Te precursor may be supplied for about 1 second to about 10 seconds. In an implementation, the Te precursor supply time may vary depending on the deposition equipment. If the Te precursor supply time were to be too long, a Te thin film could be formed on the GeSb thin film. If the Te precursor supply time were to be too short, tellurization of the GeSb film may not be completely achieved.

In operation S132 of purging the Te precursor, argon (Ar) or nitrogen ($N_2$) may be used. In an implementation, the Te precursor purge time may be about 30 seconds to about 120 seconds. In an implementation, the Te precursor purge time may vary depending on the deposition equipment. In operation S132 of purging the Te precursor, a time for Te to diffuse may be secured and excessive accumulation of Te precursors may be prevented.

Figure 7A:
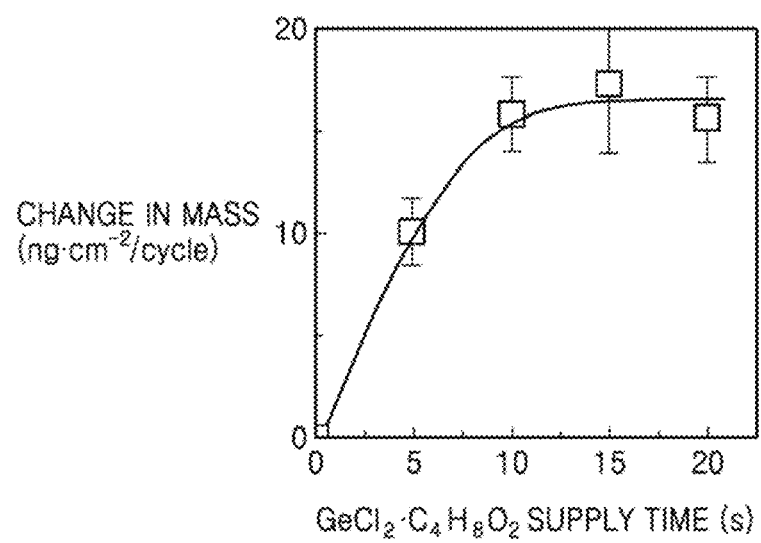
FIG. 7A is a graph showing a change in mass of a sample according to a Ge precursor supply time.

FIG. 7A is a graph showing a change in mass of a sample according to a Ge precursor supply time.

Referring to FIG. 7A, $GeCl_2 \cdot C_4H_8O_2$ was used as the Ge precursor. As the Ge precursor supply time increased, the amount of Ge precursor accumulated on the sample increased, and accordingly, the mass of the sample increased. When the Ge precursor supply time exceeded about 10 seconds to about 20 seconds, the amount of the Ge precursor on the sample saturated, and accordingly, the quality of the sample was constant. In an implementation, the Ge precursor supply time may be set to about 10 seconds to about 20 seconds, which is the time when the Ge precursor may be saturated. In an implementation, the Ge precursor saturation time may vary depending on the deposition equipment. If the Ge precursor supply time were to be too long, productivity cold decrease due to an increase in the process time. In addition, the Ge precursor purge time could increase. Chemicals could also be wasted. If the Ge precursor supply time were to be too short, the step coverage could be reduced.

FIG. 7B is a graph showing a change in mass of a sample according to an Sb precursor supply time.

Referring to FIG. 7B, $Sb(Si(C_2H_5)_3)_3$ was used as the Sb precursor. As the Sb precursor supply time increased, the amount of Sb precursor accumulated on the sample increased, and accordingly, the mass of the sample increased. When the Sb precursor supply time exceeded about 10 seconds to about 25 seconds, the amount of the Sb precursor on the sample saturated, and accordingly, the quality of the sample was constant. In an implementation, the Sb precursor supply time may be set to about 10 seconds to about 25 seconds, which is the time when the Sb precursor may be saturated. In an implementation, the Sb precursor saturation time may vary depending on the deposition equipment. If the Sb precursor supply time were to be too long, productivity could decrease due to an increase in the process time. In addition, the Sb precursor purge time could increase. Chemicals could also be wasted. If the Sb precursor supply time were to be too short, the step coverage could be reduced.

Figure 8A:
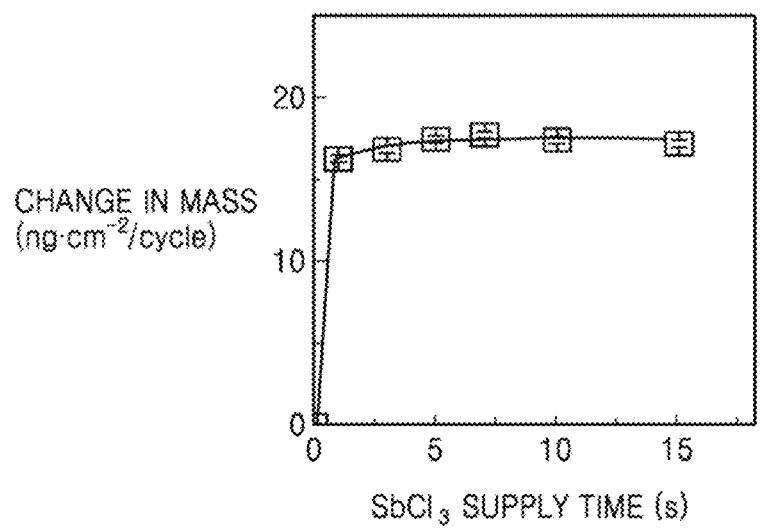
FIG. 8A is a graph showing a change in mass of a sample according to a first Sb precursor supply time.

FIG. 8A is a graph showing a change in mass of a sample according to a first Sb precursor supply time.

Referring to FIG. 8A, $SbCl_3$ was used as the first Sb precursor. As the first Sb precursor supply time increased, the amount of the first Sb precursor accumulated on the sample increased, and accordingly, the mass of the sample increased. When the first Sb precursor supply time exceeded about 5 seconds to about 20 seconds, the amount of the first Sb precursor on the sample saturated, and accordingly, the quality of the sample was constant. In an implementation, the first Sb precursor supply time may be set to about 5 seconds to about 20 seconds, which is the time when the first Sb precursor may be saturated. In an implementation, the first Sb precursor saturation time may vary depending on the deposition equipment. If the first Sb precursor supply time were to be too long, productivity could decrease due to an increase in the process time. In addition, the first Sb precursor purge time could increase. Chemicals could also be wasted. If the first Sb precursor supply time were to be too short, the step coverage could be reduced.

Figure 8B:
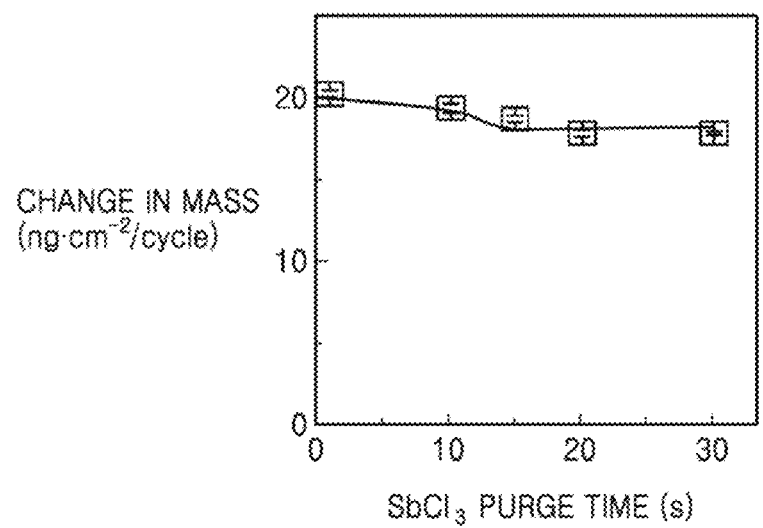
FIG. 8B is a graph showing a change in mass of a sample according to a first Sb precursor purge time.

FIG. 8B is a graph showing a change in mass of a sample according to a first Sb precursor purge time.

Referring to FIG. 8B, $SbCl_3$ was used as the first Sb precursor. As the first Sb precursor purge time increased, the amount of the first Sb precursor removed from the sample increased, and thus, the mass of the sample decreased. When the first Sb precursor purge time exceeded about 10 seconds to about 30 seconds, the amount of the first Sb precursor removed from the sample no longer increased, and accordingly, the quality of the sample was constant. In an implementation, the first Sb precursor purge time may be set to about 10 seconds to about 30 seconds. In an implementation, the first Sb precursor purge time may vary depending on the deposition equipment. If the first Sb precursor purge time were to be too long, productivity could decrease due to an increase in the process time. If the first Sb precursor purge time were to be too short, CVD could occur simultaneously, and thus, step coverage could reduce. In addition, deposition equipment could also be contaminated.

Figure 9A:
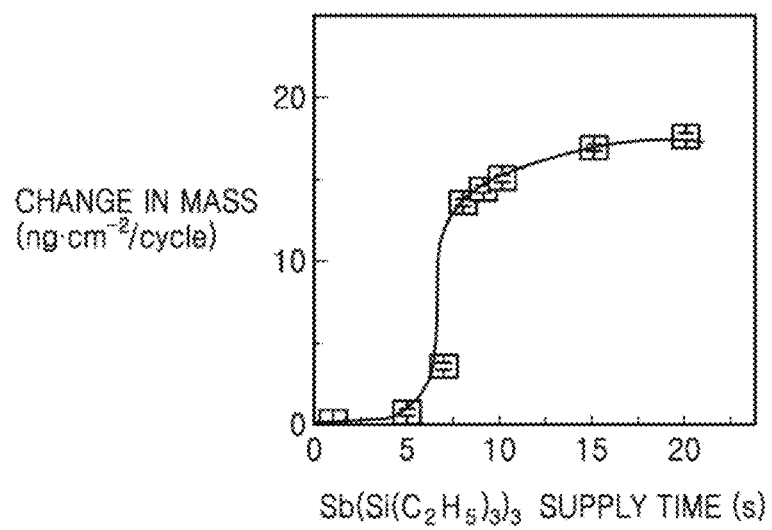
FIG. 9A is a graph showing a change in mass of a sample according to a second Sb precursor supply time.

FIG. 9A is a graph showing a change in mass of a sample according to a second Sb precursor supply time.

Referring to FIG. 9A, $Sb(Si(C_2H_5)_3)_3$ was used as the second Sb precursor. As the second Sb precursor supply time increased, the amount of the second Sb precursor accumulated on the sample increased, and accordingly, the mass of the sample increased. When the second Sb precursor supply time exceeded about 15 seconds to about 60 seconds, the amount of the second Sb precursor on the sample saturated, and accordingly, the quality of the sample was constant. In an implementation, the second Sb precursor supply time may be set to about 15 seconds to about 60 seconds, which is the time when the second Sb precursor may be saturated. In an implementation, the second Sb precursor saturation time may vary depending on the deposition equipment. If the second Sb precursor supply time were to be too long, productivity could decrease due to an increase in the process time. In addition, the second Sb precursor purge time could increase. Chemicals could also be wasted. if the second Sb precursor supply time were to be too short, the step coverage could be reduced.

Figure 9B:
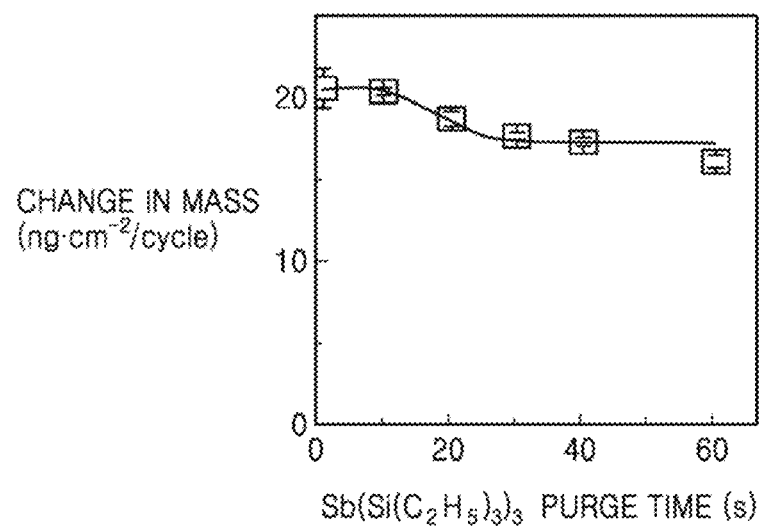
FIG. 9B is a graph showing a change in mass of a sample according to a second Sb precursor purge time.

FIG. 9B is a graph showing a change in mass of a sample according to a second Sb precursor purge time.

Referring to FIG. 9B, $Sb(Si(C_2H_5)_3)_3$ was used as the second Sb precursor. As the second Sb precursor purge time increased, the amount of the second Sb precursor removed from the sample increased, and thus, the mass of the sample decreased. When the second Sb precursor purge time exceeded about 20 seconds to about 60 seconds, the amount of the second Sb precursor removed from the sample no longer increased, and accordingly, the quality of the sample was constant. In an implementation, the second Sb precursor purge time may be set to about 20 seconds to about 60 seconds. In an implementation, the second Sb precursor purge time may vary depending on the deposition equipment. If the second Sb precursor purge time were to be too long, productivity could decrease due to an increase in the process time. If the second Sb precursor purge time were to be too short, CVD could occur simultaneously, and thus, step coverage could be reduced. In addition, deposition equipment could also be contaminated.

Figure 10:
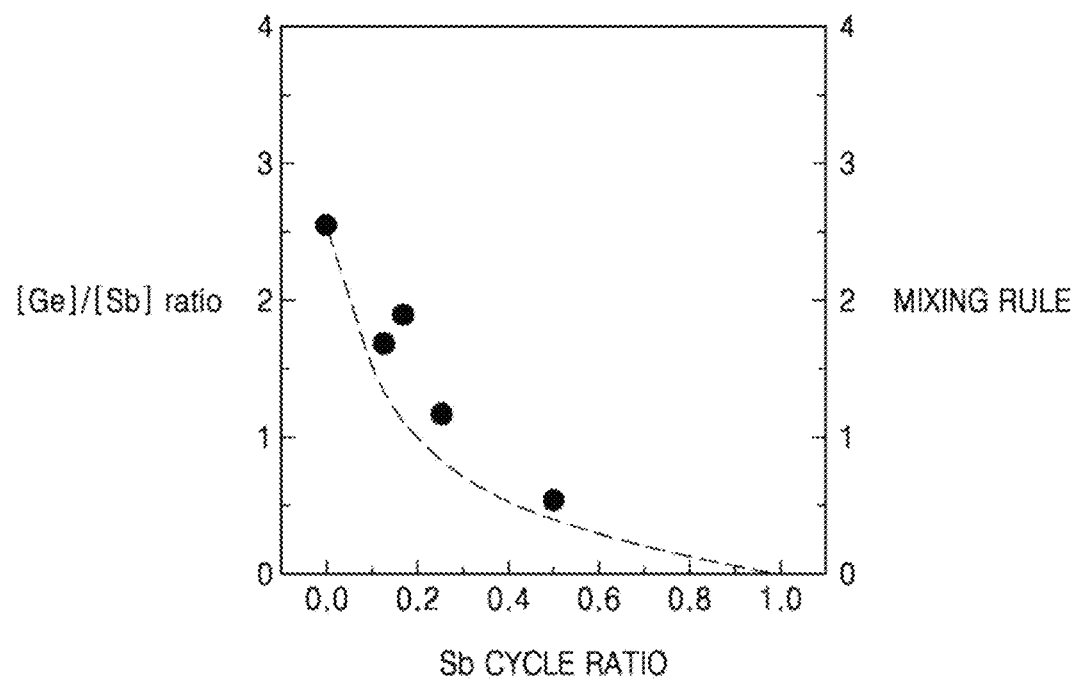
FIG. 10 is a graph showing Ge to Sb composition ratios according to Sb cycle ratios.

FIG. 10 is a graph showing Ge to Sb composition ratios according to Sb cycle ratios.

Referring to FIG. 10, the Sb cycle ratio may be defined as (the number of times of performing Sb cycles)/(the number of times of performing GeSb cycles+the number of times of performing Sb cycles). For samples with Sb cycle ratios of 0, 0.13, 0.17, 0.25, and 0.5, a [Ge]/[Sb] ratio was measured. As a result, a [Ge]/[Sb] ratio of 0.5 to 2.5 was measured. It may be seen that the composition ratio of Ge to Sb may be adjusted by adjusting the ratio of the number of times of performing GeSb cycles to the number of times of performing Sb cycles.

Figure 11:
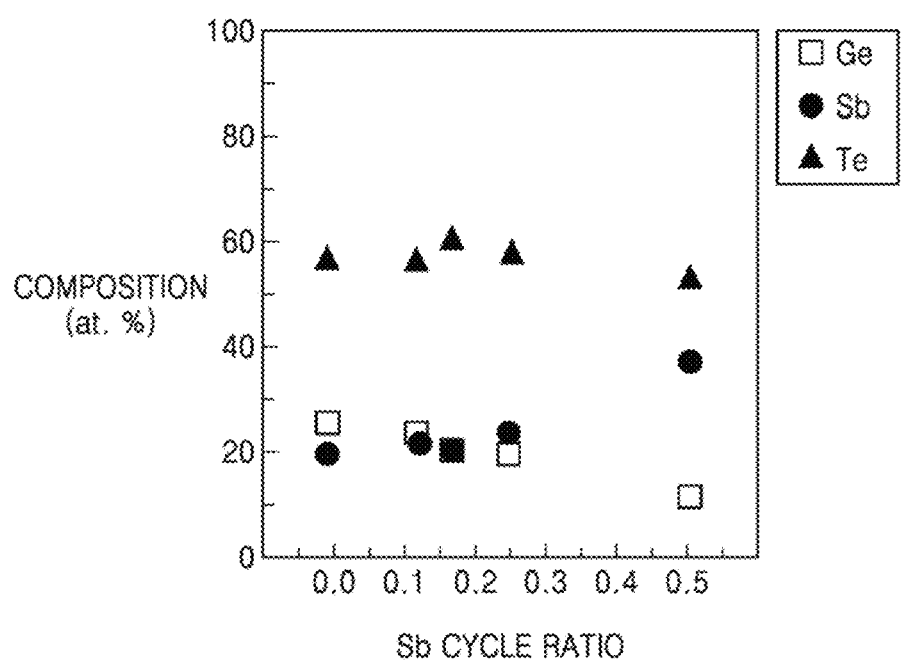
FIG. 11 is a graph showing the composition of a GeSbTe film according to Sb cycle ratios.

FIG. 11 is a graph showing the composition of a GeSbTe film according to Sb cycle ratios.

Referring to FIG. 11, the composition of the GeSbTe film after the tellurization operation was analyzed using an Auger electron spectroscopy (AES) depth profile. In the graph, the Sb cycle ratio may be defined as (the number of times of performing Sb cycles)/(the number of times of performing GeSb cycles+the number of times of performing Sb cycles). The composition ratio of Ge to Sb changed according to the Sb cycle ratio. It may be seen that the composition ratio of Ge to Sb may be adjusted by adjusting the ratio of the number of times of performing GeSb cycles to the number of times of performing Sb cycles.

Figure 12:
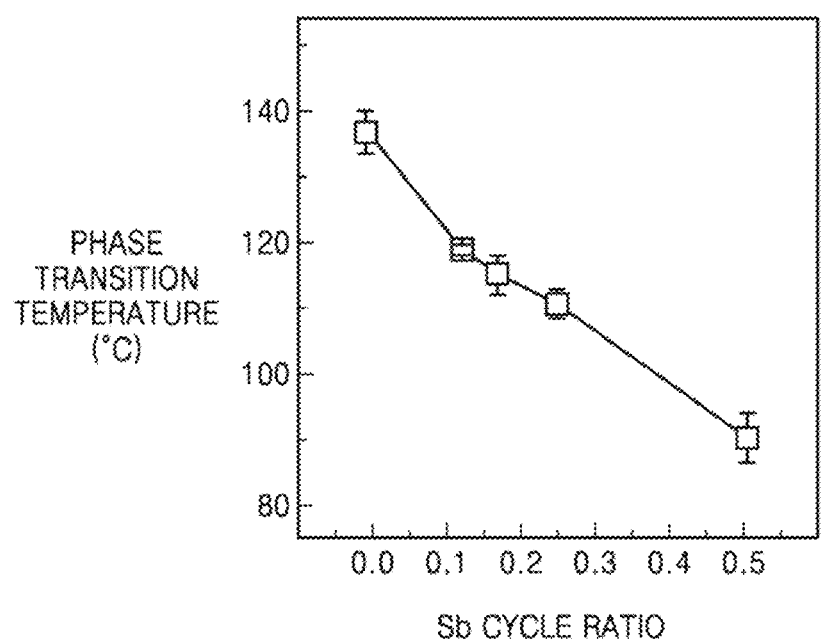
FIG. 12 is a graph showing a phase transition temperature of a GeSbTe film according to Sb cycle ratios.

FIG. 12 is a graph showing a phase transition temperature of a GeSbTe film according to Sb cycle ratios.

Referring to FIG. 12, in the graph, the Sb cycle ratio may be defined as (the number of times of performing Sb cycles)/(the number of times of performing GeSb cycles+the number of times of performing Sb cycles). According to the Sb cycle ratio, the composition ratio of Ge to Sb changed, and accordingly, the phase transition temperature changed. Specifically, as the Sb composition ratio increased, the phase transition concentration decreased from about 140° C. to about 90° C. It may be seen that the phase transition temperature may be adjusted by adjusting the Sb cycle ratio.

Figure 13:
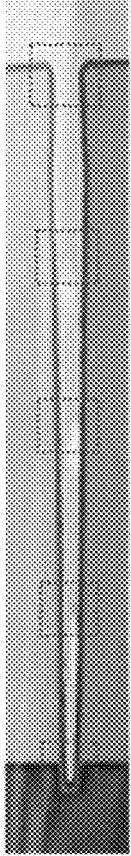
FIG. 13 is a diagram of transmission electron microscope (TEM) and energy dispersion X-ray spectroscopy (EDS) analysis images of a GeSbTe film formed according to an embodiment.

FIG. 13 is a diagram illustrating transmission electron microscope (TEM) and energy dispersion X-ray spectroscopy (EDS) analysis images of a GeSbTe film formed according to an embodiment of the inventive concept.

A GeSbTe film was formed in a hole having a high aspect ratio. According to the TEM analysis image, based on the thickness of the GeSbTe film portion on the upper portion of the hole, the GeSbTe film over the upper middle portion, the middle portion, the lower middle portion, and the lower portion of the hole showed a step coverage of 85% or more. When Ge, Sb, and Te were respectively observed using EDS, it may be seen that Ge, Sb, and Te were uniformly distributed over the GeSbTe thin film.

By way of summation and review, GeSbTe may be used as a phase change material. A film of a phase change material may be formed by a physical vapor deposition (PVD) method including a sputtering process. The PVD method could cause low step coverage.

One or more embodiments may provide a method of forming a GeSbTe film including a preferred composition and high step coverage.

One or more embodiments may provide a method of forming a phase change material film.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of forming a germanium antimony tellurium (GeSbTe) layer, the method comprising:
   forming a germanium antimony (GeSb) layer by repeatedly performing a GeSb supercycle; and
   forming the GeSbTe layer by performing a tellurization operation on the GeSb layer,
   wherein:
   performing the GeSb supercycle includes:
      performing at least one GeSb cycle; and
      performing at least one Sb cycle,
      wherein in performing the at least one GeSb cycle, Ge atoms and Sb atoms are supplied concurrently; and
   GeSbTe of the GeSbTe layer has a composition of $Ge_2Sb_{2+a}Te_{5+b}$, in which a and b satisfy the following relations: $-0.2<a<0.2$ and $-0.5<b<0.5$.

2. The method as claimed in claim 1, wherein performing the at least one GeSb cycle includes:
   pulsing a Ge precursor;
   purging the Ge precursor;
   pulsing an Sb precursor; and
   purging the Sb precursor.

3. The method as claimed in claim 2, wherein the Ge precursor includes $Ge(CH_3)_4$, $Ge(C_2H_5)_4$, $Ge(C_3H_7)_4$, Ge(N $(CH_3)_2)_4$, $Ge(N(C_2H_5)_2)_4$, $Ge(OCH_3)_4$, $Ge(OC_2H_5)_4$, $Ge(O(^iC_3H_7)_4)$, $GeCl_2 \cdot C_4H_8O_2$, $GeCl_4$, $GeF_4$, $HGeCl_3$, germylene, or Ge(II)-amido guanidinate.

4. The method as claimed in claim 2, wherein the Sb precursor includes $SbCl_3$, $Sb(Si(CH_3)_3)_3$, $Sb(Si(C_2H_5)_3)_3$, $Sb(Si(C_3H_7)_3)_3$, $Sb(Si(N(CH_3)_2)_3)_3$, $Sb(Si(N(C_2H_5)_2)_3)_3$, $Sb(Ge(CH_3)_3)_3$, $Sb(Ge(C_2H_5)_3)_3$, $Sb(Ge(N(CH_3)_2)_3)_3$, or $Sb(Ge(N(C_2H_5)_2)_3)_3$.

5. The method as claimed in claim 2, wherein performing the at least one GeSb cycle further includes:
pulsing an accelerator; and
purging the accelerator.

6. The method as claimed in claim 5, wherein the accelerator includes ammonia, ethanol, or methanol.

7. The method as claimed in claim 1, wherein the at least one GeSb cycle is performed at a temperature of about 70° C. to about 130° C.

8. The method as claimed in claim 1, wherein the at least one GeSb cycle is performed at a pressure of about 0.1 Torr to about 10 Torr.

9. The method as claimed in claim 1, wherein performing the at least one Sb cycle includes:
pulsing a first Sb precursor;
purging the first Sb precursor;
pulsing a second Sb precursor; and
purging the second Sb precursor.

10. The method as claimed in claim 9, wherein the first Sb precursor includes $SbCl_3$, $SbF_3$, $SbBr_3$, or $SbI_3$.

11. The method as claimed in claim 9, wherein the second Sb precursor includes $Sb(Si(CH_3)_3)_3$, $Sb(Si(C_2H_5)_3)_3$, $Sb(Si(C_3H_7)_3)_3$, $Sb(Si(N(CH_3)_2)_3)_3$, $Sb(Si(N(C_2H_5)_2)_3)_3$, $Sb(Ge(CH_3)_3)_3$, $Sb(Ge(C_2H_5)_3)_3$, $Sb(Ge(N(CH_3)_2)_3)_3$, or $Sb(Ge(N(C_2H_5)_2)_3)_3$.

12. The method as claimed in claim 9, wherein performing the at least one Sb cycle further includes:
pulsing an accelerator; and
purging the accelerator.

13. The method as claimed in claim 12, wherein the accelerator includes ammonia, ethanol, or methanol.

14. The method as claimed in claim 1, wherein the at least one Sb cycle is performed at a temperature of about 70° C. to about 130° C.

15. The method as claimed in claim 1, wherein the at least one Sb cycle is performed at a pressure of about 0.1 Torr to about 10 Torr.

16. The method as claimed in claim 1, wherein performing the tellurization operation includes:
pulsing a Te precursor; and
purging the Te precursor.

17. The method as claimed in claim 16, wherein the Te precursor includes $H_2Te$, $Te(CH_3)_2$, $Te(C_2H_5)_2$, $Te(C_3H_7)_2$, $Te(^iC_4H_9)_2$, $Te(N(CH_3)_2)_2$, $Te(N(C_2H_5)_2)_2$, $Te(N(^iC_3H_7)_2)_2$, $Te(OCH_3)_2$, $Te(OC_2H_5)_2$, $Te(O(C_3H_7)_2)_2$, $Te(Si(CH_3)_3)_2$, $Te(Si(C_2H_5)_3)_2$, $Te(Si(C_3H_7)_3)_2$, $Te(Si(N(CH_3)_2)_3)_2$, $Te(Si(N(C_2H_5)_2)_3)_2$, $Te(Ge(CH_3)_3)_2$, $Te(Ge(C_2H_5)_3)_2$, $Te(Ge(N(CH_3)_2)_3)_2$, or $Te(Ge(N(C_2H_5)_2)_3)_2$.

18. The method as claimed in claim 1, wherein the tellurization operation is performed at a temperature of about 200° C. to about 250° C.

19. A method of forming a GeSbTe layer, the method comprising:
forming a GeSb layer by repeatedly performing a GeSb supercycle; and
forming the GeSbTe layer by performing a tellurization operation on the GeSb layer,
wherein:
performing the GeSb supercycle includes:
performing at least one GeSb cycle; and
performing at least one Sb cycle,
wherein in performing the at least one GeSb cycle, Ge atoms and Sb atoms are supplied concurrently;
GeSbTe of the GeSbTe layer has a composition of $Ge_2Sb_{2+a}Te_{5+b}$, in which a and b satisfy the following relations: $-0.2<a<0.2$ and $-0.5<b<0.5$,
performing the at least one GeSb cycle includes:
pulsing a Ge precursor;
purging the Ge precursor;
pulsing an Sb precursor; and
purging the Sb precursor,
performing the at least one Sb cycle includes:
pulsing a first Sb precursor;
purging the first Sb precursor;
pulsing a second Sb precursor; and
purging the second Sb precursor, and
performing the tellurization operation includes:
pulsing a Te precursor; and
purging the Te precursor.

20. A method of forming a GeSbTe layer, the method comprising:
forming a GeSb layer by repeatedly performing a GeSb supercycle; and
forming the GeSbTe layer by performing a tellurization operation on the GeSb layer,
wherein:
performing the GeSb supercycle includes:
performing at least one GeSb cycle; and
performing at least one Sb cycle,
wherein in performing the at least one GeSb cycle, Ge atoms and Sb atoms are supplied concurrently;
GeSbTe of the GeSbTe layer has a composition of $Ge_2Sb_{2+a}Te_{5+b}$, in which a and b satisfy the following relations: $-0.2<a<0.2$ and $-0.5<b<0.5$,
performing the at least one GeSb cycle includes:
pulsing $GeCl_2 \cdot C_4H_8O_2$;
purging the $GeCl_2 \cdot C_4H_8O_2$;
pulsing $Sb(Si(C_2H_5)_3)_3$; and
purging the $Sb(Si(C_2H_5)_3)_3$, and
performing the at least one Sb cycle includes:
pulsing $SbCl_3$;
purging the $SbCl_3$;
pulsing $Sb(Si(C_2H_5)_3)_3$; and
purging the $Sb(Si(C_2H_5)_3)_3$.

* * * * *